(12) United States Patent
Brown et al.

(10) Patent No.: US 6,870,398 B2
(45) Date of Patent: Mar. 22, 2005

(54) DISTRIBUTED MEMORY AND LOGIC CIRCUITS

(75) Inventors: James R. Brown, Idaho Falls, ID (US); Charles A. Edmondson, Pocatello, ID (US); Brian R. Kauffmann, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 10/422,137

(22) Filed: Apr. 24, 2003

(65) Prior Publication Data

US 2004/0212396 A1 Oct. 28, 2004

(51) Int. Cl.[7] .................................................. G06F 9/38
(52) U.S. Cl. ............................ 326/47; 326/39; 326/41
(58) Field of Search .............................. 326/38–41, 44, 326/45, 46, 47

(56) References Cited

U.S. PATENT DOCUMENTS

| | | | |
|---|---|---|---|
| 5,040,146 A | 8/1991 | Mattausch et al. | |
| 5,239,237 A | 8/1993 | Tran et al. | |
| 5,341,041 A | 8/1994 | El Gamal | |
| 5,654,915 A | 8/1997 | Stolmeijer et al. | |
| 5,706,226 A | 1/1998 | Chan et al. | |
| 5,744,980 A | * 4/1998 | McGowan et al. | 326/40 |
| 5,754,487 A | 5/1998 | Kim et al. | |
| 5,781,469 A | 7/1998 | Pathak et al. | |
| 5,831,897 A | 11/1998 | Hodges | |
| 5,875,139 A | 2/1999 | Semi | |
| 5,949,706 A | 9/1999 | Chang et al. | |
| 6,108,257 A | 8/2000 | Davies | |
| 6,344,992 B1 | 2/2002 | Nakamura | |
| 6,356,473 B1 | 3/2002 | Shimoyama | |
| 6,452,851 B1 | 9/2002 | Endo et al. | |
| 6,693,454 B2 | * 2/2004 | Cox | 326/39 |

OTHER PUBLICATIONS

U.S. patent application entitled "Static Random Access Memory (SRAM) Without Precharge Circuitry", given U.S. Appl. No. 10/406,523, filed Apr. 3, 2003.

* cited by examiner

Primary Examiner—Anh Q. Tran
(74) Attorney, Agent, or Firm—MacPherson Kwok Chen & Heid LLP; Greg J. Michelson

(57) ABSTRACT

Systems and methods are disclosed for distributing memory within one or more regions of circuitry that perform logic functions (or other types of functions that require dense interconnect structures) on an integrated circuit. The distributed memory reduces high density routing congestion, allows increased logic utilization, and provides areas for additional interconnect structure. Various techniques are also disclosed for accessing the memory.

19 Claims, 7 Drawing Sheets

000 US 6,870,398 B2

DISTRIBUTED MEMORY AND LOGIC CIRCUITS

TECHNICAL FIELD

The present invention relates generally to electrical circuits and, more particularly, to integrated circuits having memory and logic circuits.

BACKGROUND

Integrated circuits often include circuitry for performing logic functions as well as circuitry for providing memory. The circuitry for memory is typically arranged in certain areas of the integrated circuit and segregated from the circuitry that performs logic functions.

One drawback of this arrangement is that interconnect requirements of logic circuitry for performing certain logic functions may be very complex and utilize all of the neighboring interconnect lines and local capacity of the routing structure. Consequently, nearby logic circuitry may not be utilized due to a lack of interconnect capability, even when a high density circuit interconnect is provided on the integrated circuit.

Furthermore, integrated circuit manufacturing may use hybrid processing that combines a high density front end process and a lower density back end process. The high density front end process implements the advanced technology circuitry (e.g., logic circuitry), while the lower density back end process implements circuit interconnect using a lower cost technology. The circuit interconnect formed with the lower density back end process further exacerbates routing congestion around the logic circuitry and makes it even more difficult to fully utilize the logic circuitry due to the limited interconnect capability. As a result, there is a need for systems and methods to improve the utilization of logic circuitry and minimize interconnect limitations.

SUMMARY

Systems and methods are disclosed herein to provide distributed memory and logic circuits that provide better utilization of an interconnect structure and/or of the logic circuits. For example, by distributing memory throughout one or more portions of logic circuitry within an integrated circuit, high density routing congestion may be reduced due to the memory tending to require less interconnect capability than the logic circuits. Therefore, greater utilization of logic circuits may be realized due to the availability of circuit interconnect resources. Furthermore, in one or more embodiments, techniques are illustrated to access the memory that is distributed throughout the logic circuitry.

More specifically, in accordance with one embodiment of the present invention, an integrated circuit includes a plurality of columns of memory; and a plurality of columns of logic circuits, wherein each of the columns of memory is disposed adjacent to one of the columns of logic circuits, with the plurality of columns of memory forming at least one block of memory having rows which extend through the plurality of columns of memory.

In accordance with another embodiment of the present invention, a circuit includes a plurality of columns of memory; a plurality of columns of circuits adaptable to perform logic functions, wherein each of the columns of memory is disposed adjacent to one of the plurality of columns of circuits, with the plurality of columns of memory forming at least one block of memory having rows which extend through the plurality of columns of memory; and means for addressing and accessing memory cells within the at least one block of memory.

In accordance with another embodiment of the present invention, a method of increasing utilization of logic circuits on an integrated circuit includes arranging the logic circuits in a plurality of columns; disposing between each of the plurality of columns of the logic circuits a column of memory to reduce local interconnect requirements; and interconnecting each of the columns of memory to form at least one block of memory whose rows extend through the columns of memory.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
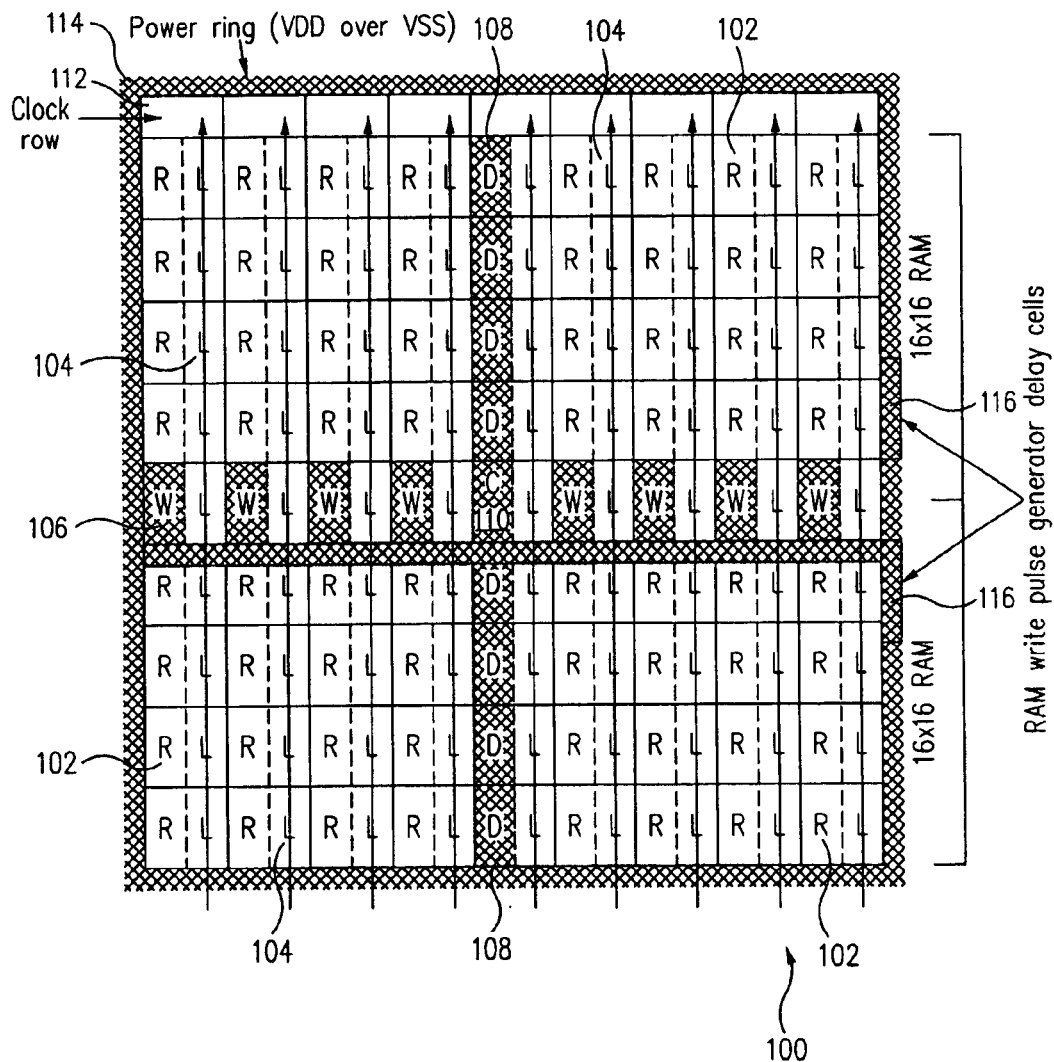
FIG. 1 shows a block diagram illustrating memory distributed within a region containing logic circuits in accordance with an embodiment of the present invention.

FIG. 1 shows a block diagram of a circuit layout 100 illustrating memory distributed within a region containing logic circuits in accordance with an embodiment of the present invention. Circuit layout 100 represents a physical layout for a portion of an integrated circuit, where circuit layout 100 may be replicated numerous times within the integrated circuit.

Circuit layout 100 includes a number of areas of memory 102 (with each separate area of memory 102 labeled "R") distributed among a number of logic circuits 104 (with each separate area of logic circuits 104 labeled "L"). Memory 102 may be any type and size of memory. For example, each one of memory 102 (i.e., each area labeled R) may contain eight memory cells (e.g., two memory cells wide by four memory cells high), with each memory cell being, for example, static random access memory (SRAM). Thus, for this example, circuit layout 100 having eight columns and eight rows of memory 102 would represent two blocks of 16 by 16 SRAM or one block of 16 by 32 SRAM. Logic circuits 104 may be any type of circuitry that can perform logic functions, such as look-up tables or a flip flop with logic gates configured to perform logic functions.

Circuit layout 100 further includes read/write (R/W) circuits 106 (labeled "W"), decode circuits 108 (labeled "D"), and a control circuit 110 (labeled "C"). R/W circuits 106 perform the read/write and data input/output (I/O) functions for each of their corresponding columns of memory 102. For example, as explained in further detail in reference to FIG. 5 and in accordance with an embodiment of the present invention, R/W circuits 106 provide and control bit lines for each of their corresponding columns of memory 102.

Figure 3:
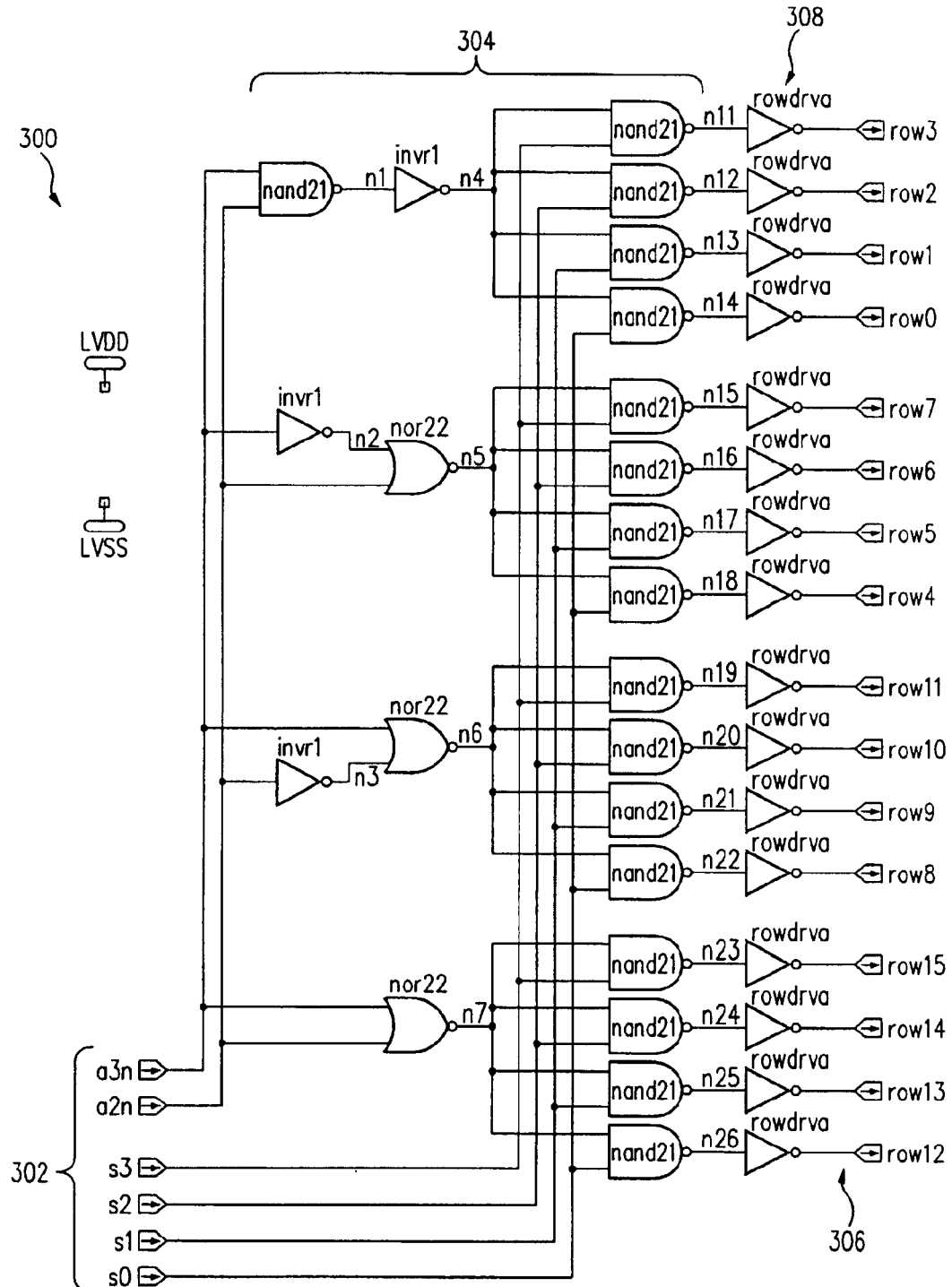
FIG. 3 shows decode circuitry for word lines in accordance with an embodiment of the present invention.

Decode circuits 108 perform the address decode and control for word lines for each of their corresponding rows of memory 102, such as for example described in reference to FIG. 3 in accordance with an embodiment of the present invention. Control circuit 110 may be used to perform various control functions and/or decode functions for memory 102 of circuit layout 100.

Figure 6:
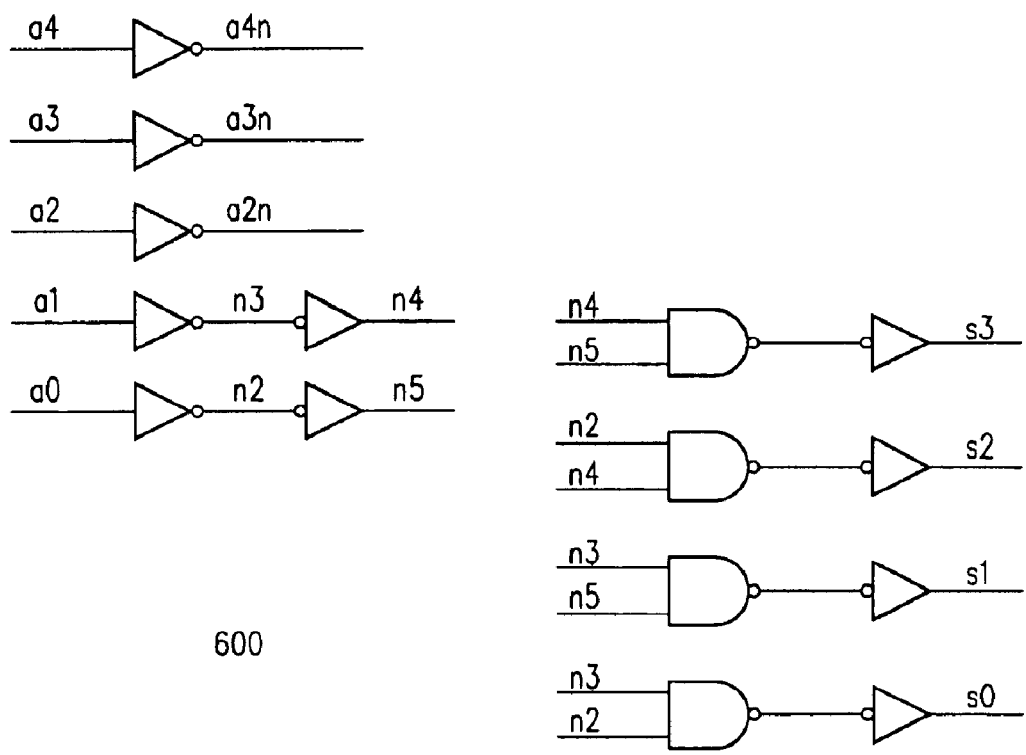
FIG. 6 shows exemplary control logic in accordance with an embodiment of the present invention.

For example, referring briefly to FIG. 6, a circuit 600 is illustrated that represents an exemplary implementation for control circuit 110. In this example, circuit 600 simply performs buffering and port address decode, such as to receive address bits (labeled a0 through a4) and generate decoded address signals (labeled s0 through s3). For example, these address signals may be carried by address lines 302 as discussed below in reference to FIG. 3.

Circuit layout 100 may also include a clock row 112 and one or more supply or reference voltages 114 and pulse generators 116. Clock row 112 includes global or local clock lines required by circuit layout 100 (e.g., for memory 102 or logic circuits 104). Supply or reference voltages 114 may be provided, for example, as a power ring surrounding circuit layout 100 and providing a supply voltage (VDD or also referred to as LVDD herein) and a ground voltage (VSS or also referred to as LVSS herein) and/or other reference voltages. Pulse generators 116 provide a RAM write pulse, such as for example to provide a write pulse for asynchronous RAM.

Circuit layout 100 illustrates, in accordance with an embodiment of the present invention, memory 102 distributed among logic circuits 104 to allow increased logic utilization of logic circuits 104. Memory 102 serves to reduce the density of logic circuits 104 and reduce interconnect congestion while providing a fully interconnected memory. Because memory 102 typically has lower interconnect requirements (e.g., fewer interconnect requirements to lower circuit layers) as compared to logic circuits 104, memory 102 distributed among logic circuits 104 allows interconnect resources to be used more effectively by logic circuits 104. Consequently, logic circuits 104 face less local competition for interconnect resources and fewer logic circuits 104 are unused due to a lack of interconnect capability.

The benefits of memory 102 among logic circuits 104 may be further appreciated for architectures where the interconnect structure is less dense than the active area. For example in hybrid technologies, where for example the metal technology (e.g., interconnect routing structure) is less dense than the transistor technology (e.g., logic circuits), memory 102 distributed among logic circuits 104 allows increased logic utilization and greater application because memory 102 requires typically fewer interconnect resources than if replaced by one of logic circuits 104. Therefore, logic circuits 104 adjacent to memory 102 have a greater chance at having interconnect resources available for their use than if logic circuits 104 were adjacent to other ones of logic circuits 104.

Furthermore, higher utilization of logic circuits 104 is possible due to additional interconnect routing available to logic circuits 104. For example, the circuit area above (or below) the columns of memory 102 (i.e., the circuit or metal layer above each of memory 102) may be utilized to provide additional interconnect for logic circuits 104. This circuit area is typically not used for logic interconnect, such as for example the area above conventional large blocks of memory, due to their separation from logic circuits. Therefore, the logic utilization of logic circuits 104 is further improved by making available more interconnect resources, above memory 102, for adjacent logic circuits 104.

Figure 2:
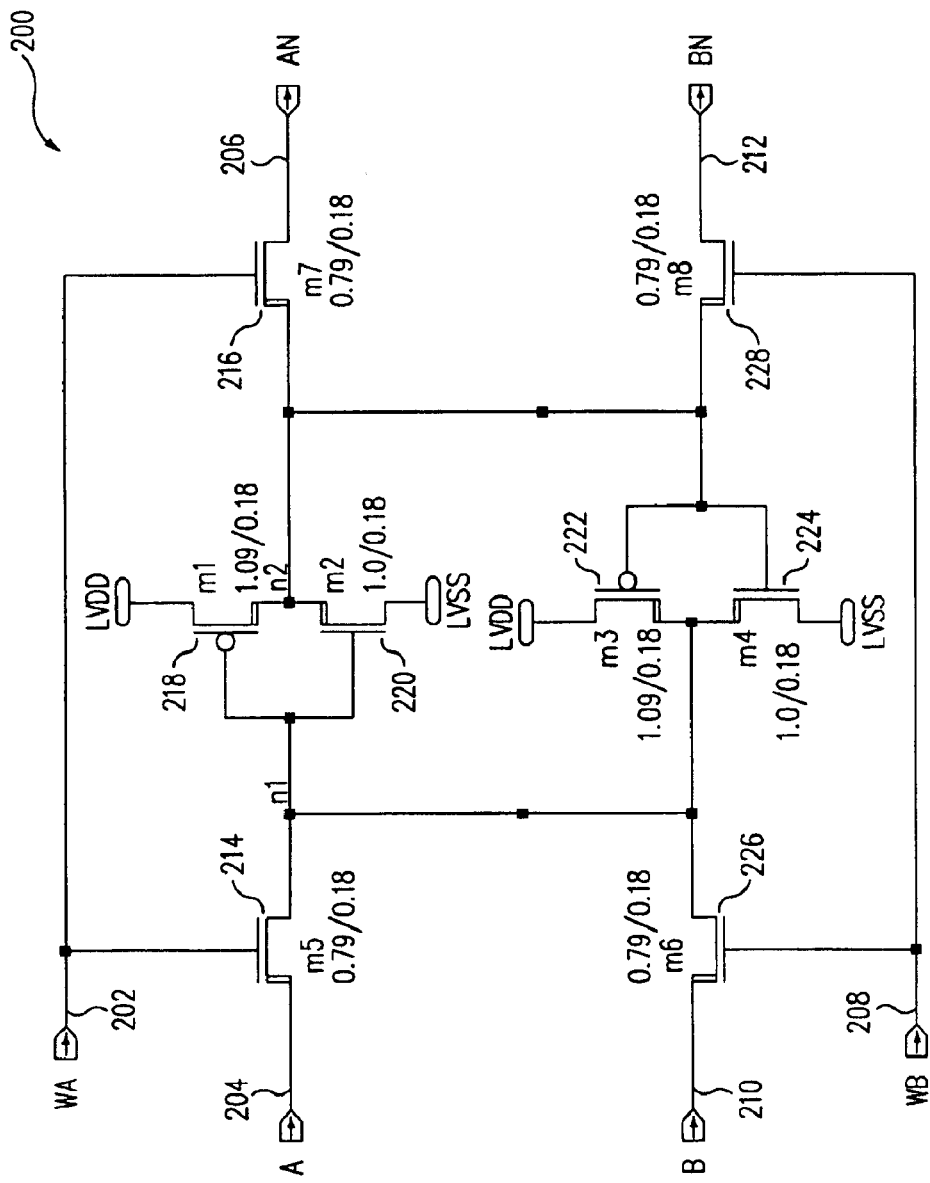
FIG. 2 shows a memory cell in accordance with an embodiment of the present invention.

FIG. 2 shows a memory cell 200 in accordance with an embodiment of the present invention. One or more of memory cells 200 may be grouped to form each one of memory 102 (i.e., each one of areas labeled R in FIG. 1). For example, eight memory cells 200 may be grouped in a two by four configuration (i.e., two columns of memory cell 200 and four rows of memory cell 200) to form each one of memory 102 (each labeled R).

Memory cell 200 is a two-port (e.g., port A and B) random access memory storage cell having a word line 202 and a word line 208, a bit line 204 and its complement bit line 206 (labeled A and AN, respectively), and a bit line 210 and its complement bit line 212 (labeled B and BN, respectively). Word line 202 and bit lines 204, 206 serve port A, while word line 208 and bit lines 210, 212 serve port B of memory cell 200.

Transistors 218 and 220 form an inverter that is coupled to another inverter formed by transistors 222 and 224 to store a data bit. Transistors 218 and 222 receive a supply voltage (labeled LVDD), while transistors 220 and 224 receive a reference voltage (labeled LVSS and represents, for example, a ground voltage). Word line 202 controls transistors 214 and 216 to provide bit lines 204, 206 with access to transistors 218 through 224 to write or read data stored by transistors 218 through 224. Similarly, word line 208 controls transistors 226 and 228 to provide bit lines 210, 212 with access to transistors 218 through 224 to write or read data stored by transistors 218 through 224.

FIG. 3 shows a decode circuit 300 for word lines in accordance with an embodiment of the present invention. Decode circuit 300 represents, for example, one of four circuits that control word lines for circuit layout 100 of FIG. 1 (assuming each row of memory 102 is configured as a two by four memory block, as described in a previous example). Therefore for this example, one of decode circuit 300 would control word lines for port A for the first four rows shown within circuit layout 100, another decode circuit 300 would control word lines for port B for these first four rows, another decode circuit 300 would control word lines for port A for the remaining four rows shown, and the fourth decode circuit 300 would control word lines for port B for these remaining four rows.

The four decode circuits 300 would occupy the space identified as decode circuits 108 in FIG. 1. For example, two of decode circuits 300 would occupy the area in decode circuits 108 on the top half of circuit layout 100 to provide word line decode for corresponding port A and B, while the remaining two of decode circuits 300 would occupy the area in decode circuits 108 on the lower half of circuit layout 100 to provide word line decode for corresponding port A and B.

Decode circuits 300 includes address lines 302 (labeled s0, s1, s2, s3, a2n, and a3n) that are pre-decoded and that carry signals that are used by address decode logic 304 to determine which one of word lines 306 (labeled row0, row1, . . . , through row15) to assert. Address decode logic 304 includes various logic gates, such as inverters, NOR gates, and NAND gates, as shown to properly select the appropriate one of word lines 306. As explained above, the sixteen of word lines 306 support row addressing for 16 rows of memory for one port (e.g., 16 rows of memory cell 200 of FIG. 2 for one port, port A or port B). In reference to FIG. 1, each row of memory 102, from the eight shown, has four rows of memory cells for a combined total of 32 rows of memory cells 102.

Decode circuit 300 also includes row drivers 308 (each labeled rowdrva) to drive an appropriate voltage level onto corresponding word lines 306. Due to the distribution of columns of memory 102 (as shown in FIG. 1) among logic circuits 104, word lines 306 are longer than typical word lines to span across all of the columns of memory 102 to activate the addressed word. Word lines 306 are not particularly sensitive to noise coupling, as the voltage levels on word lines 306 swing rail to rail. However, word lines 306, depending upon their length based on the intended application, may require a larger driver to compensate for the additional capacitance associated with the length of word lines 306.

Figure 4:
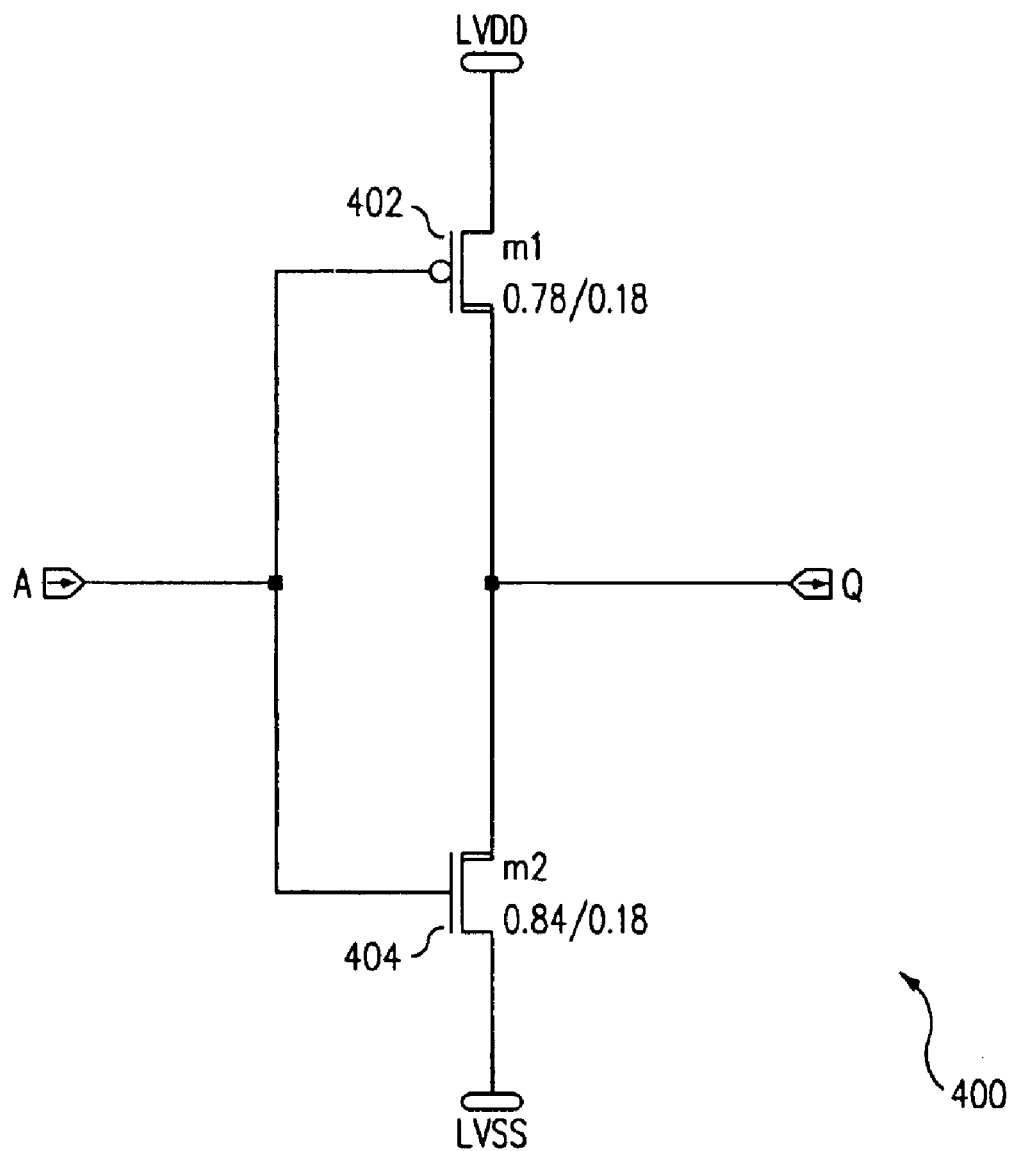
FIG. 4 shows a row driver for the word lines in accordance with an embodiment of the present invention.

Row drivers 308 may be designed to compensate for the additional capacitance due to the length of corresponding word lines 306. For example, FIG. 4 shows a row driver 400 in accordance with an embodiment of the present invention, which is an exemplary implementation for one of row drivers 308. Row driver 400 includes a p-channel transistor 402 and an n-channel transistor 404 that are coupled to form an inverter stage. By adjusting a size of transistor 402, a rise time of a word line is determined.

For example, if the size of transistor 402 is increased the drive capability of row driver 400 is increased and the rise time of the voltage level on the associated word line is decreased. Likewise, for a shorter word line, the size of transistor 402 may be relatively reduced to maintain or provide a desired voltage level rise time. Further details regarding driver design and memory circuitry may be found in U.S. patent application Ser. No. 10/406,526 entitled "Static Random Access Memory (SRAM) Without Precharge Circuitry" filed Apr. 3, 2003, which is hereby incorporated by reference in its entirety.

Figure 5:
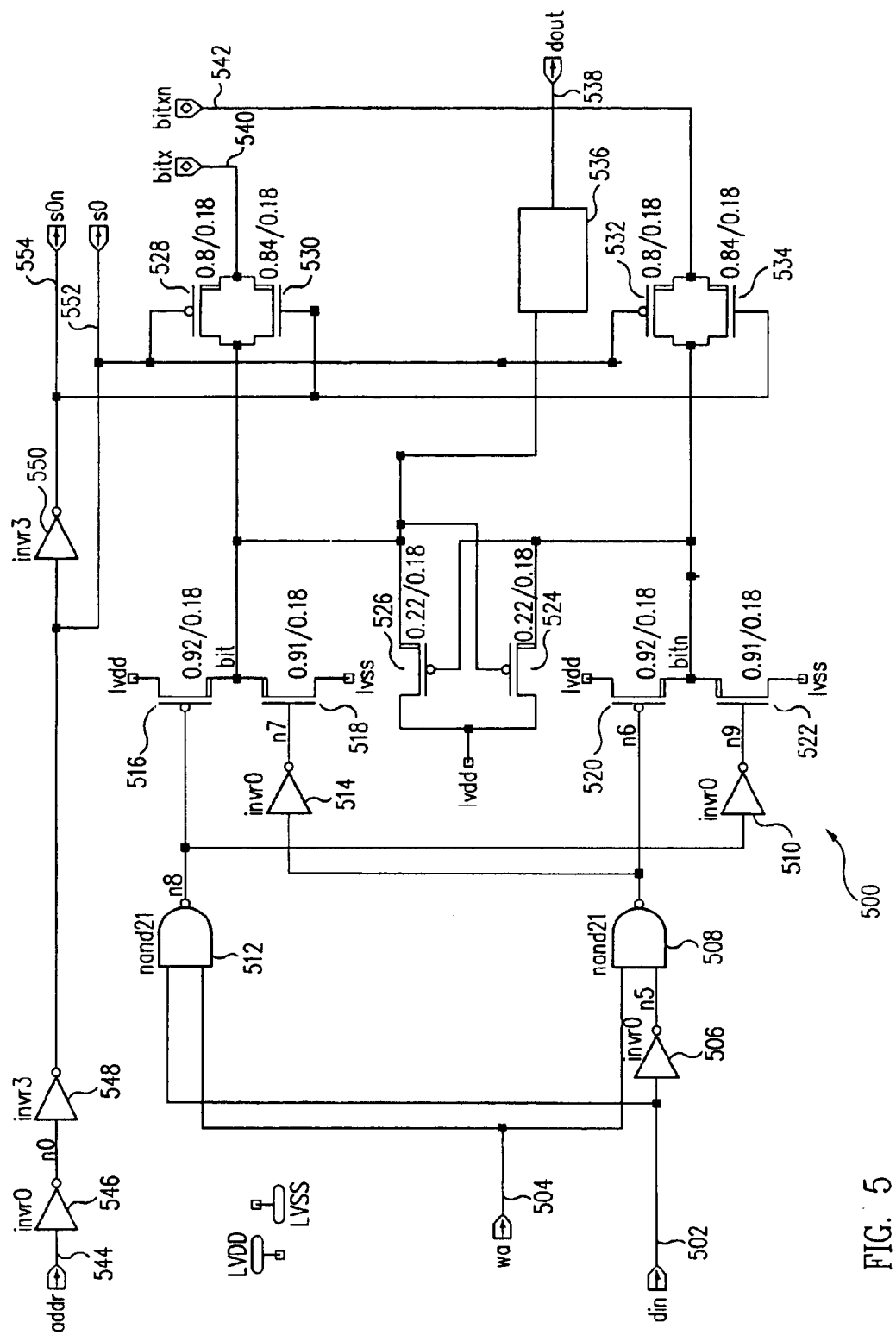
FIG. 5 shows read/write circuitry in accordance with an embodiment of the present invention.

FIG. 5 shows a read/write (R/W) circuit 500 in accordance with an embodiment of the present invention. R/W circuit 500 is an exemplary circuit implementation for R/W circuits 106 of FIG. 1 and provides read and write functions via a pair of bit lines 540, 542 that extend through a corresponding column of memory cells within memory 102. For example, if each one of memory 102 (i.e., each area labeled R in FIG. 1) represents a group of memory cells that are arranged as two wide by four high (i.e., two columns and four rows of memory cells 200 of FIG. 2), then four R/W circuits 500 would be required for each R/W circuit 106 (i.e., for each of the areas labeled W in FIG. 1) to provide read/write capability for the four sets of bit lines (i.e., two columns of memory cells, with each column having two ports).

R/W circuit 500 receives signals on a data line 502 (labeled din), a write enable line 504 (labeled we), and an address line 544 (labeled addr), and provides an output signal (data) on an output data line 538 (labeled dout). Data line 502 carries data to be written to memory under control of a signal carried on write enable line 504. Inverters 506, 510, and 514 and NAND gates 508 and 512 determine if a write operation should occur (based on a signal value on write enable line 504) and provide the appropriate signal (based on a signal level on data line 502) on bit lines 540, 542 via transistors 516 and 518 and transistors 520 and 522, which form respective inverters to drive the signal onto corresponding bit lines 540, 542.

Address line 544 provides an address signal via inverters 546 and 548 to address lines 552 and 554 (labeled s0 and s0n, respectively), with address line 554 employing an inverter 550 to form the complement of the address signal. The address signal on address lines 552, 554 (true and complement address signal, respectively) control transmission gates formed by transistors 528 and 530 and transistors 532 and 534, which determine whether R/W circuit 500 has access to bit lines 540 and 542 (true and complement bit lines which are labeled respectively bitx and bitxn) for a read or a write operation. For example, bit lines 540 and 542 may represent (or couple with) the bit lines 204 and 206, respectively, discussed in reference to FIG. 2.

As discussed above, utilizing the area above (or below) the distributed memory columns (i.e., columns of memory 102 in FIG. 1) for interconnect structure provides for greater utilization of logic circuits 104. For example, referring briefly to FIG. 7, a block diagram is shown of a cross-sectional side view of an exemplary physical circuit layout 700 in accordance with an embodiment of the present invention.

Circuit layout 700 includes a column of RAM cells located in an area to the left and below a dashed line 702 and a column of RAM cells located in an area to the right and below a dashed line 704. A section of logic 706 is located between and above dashed lines 702 and 704. A metal 1 layer and a metal 2 layer that resides above logic 706 may be used, for example, to form logic cells, such as NAND gates and flip flops (e.g., on the gate array base of logic transistors).

The metal 1 layer and the metal 2 layer above RAM cells (designated by dashed lines 702 and 704) interconnect multiple RAM cells. For example, the metal 1 layer is used for word lines and the metal 2 layer is used for bit lines. The word lines of metal 1 layer connect multiple columns of RAM cells together (e.g., connecting RAM cells columns within dashed lines 702 and 704) by passing though but not connecting to the logic cells associated with logic 706.

For example, the word lines of metal 1 layer bend or are routed through the logic cells, which makes the metal 1 layer within dashed line 702 to erroneously appear to be unconnected to the metal 1 layer within dashed line 704. The bit lines of the metal 2 layer run perpendicular to the word lines of the metal 1 layer and connect multiple RAM cells within the column (with no logic disposed between them).

All connections necessary to build the RAM cells may be completed on the gate array base layers utilizing the metal 1 layer and the metal 2 layer. Consequently, custom metal layers (i.e., metal layers 3 through 5) are available, for example, to interconnect logic 706 or logic cells associated with logic 706. For example, the metal layer 3 may be utilized to spread logic interconnect over the RAM cells (within dashed lines 702 and 704) to provide logic cells or logic 706 access to more connection points associated with the metal 4 layer and effectively increasing the available wiring to interconnect logic 706. It should be understood, for example, that circuit layout 700 may be replicated, each adjacent to the other in a side-by-side fashion, to form a repeating pattern of RAM column, logic column, RAM column, logic column, RAM column, etc., such as illustrated in FIG. 1.

Figure 7:
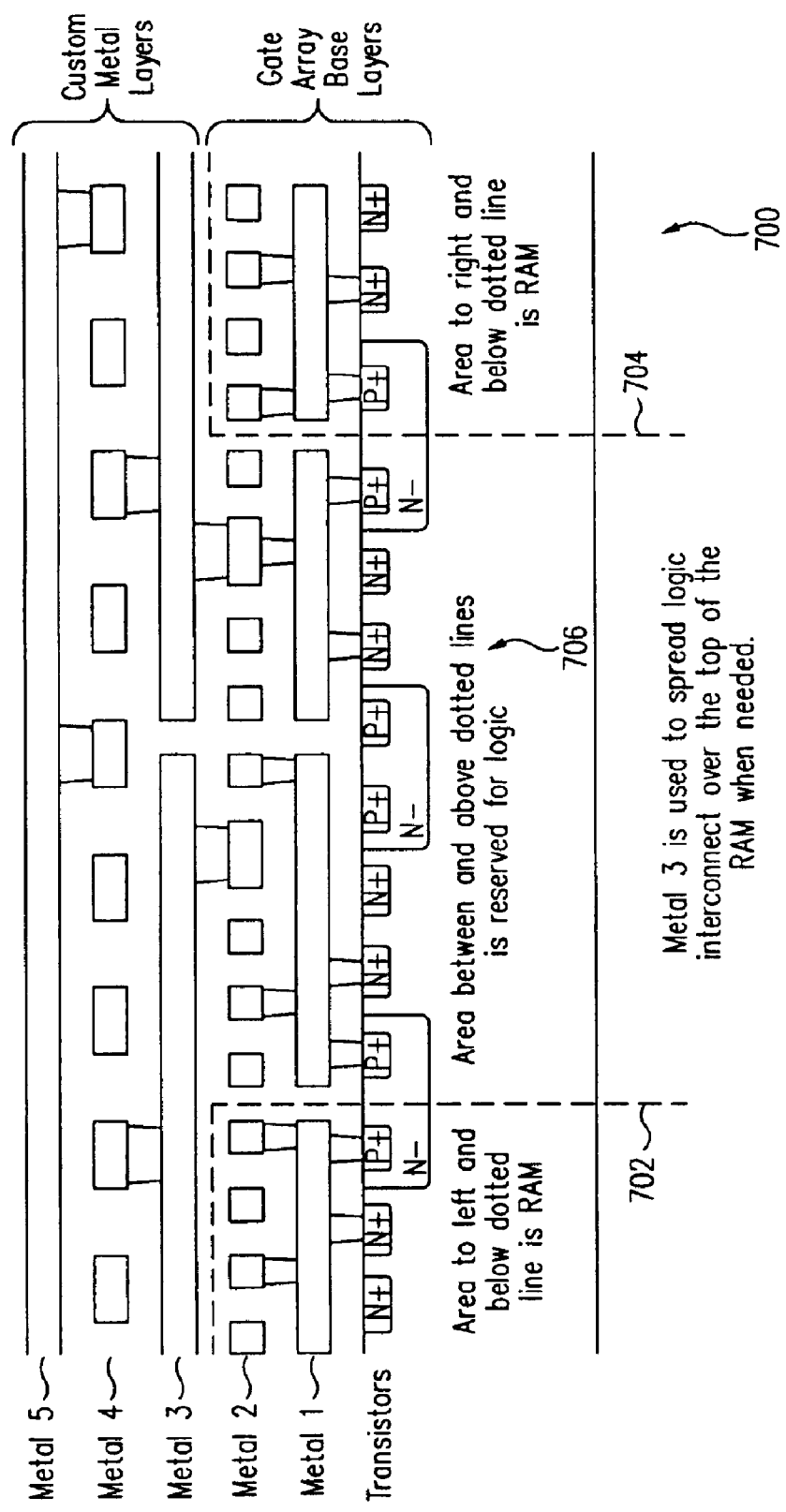
FIG. 7 shows a block diagram of a cross-sectional side view of a physical circuit layout in accordance with an embodiment of the present invention.

Referring to FIGS. 1 and 7, additional capacitive coupling may occur between memory 102 and the interconnect structure (e.g., interconnect lines). A conventional latched sense amplifier for reading data from memory 102 would be more sensitive to this noise coupling due to the possibility of noise coupling occurring at the same time as sensing of the data value, which might result in corruption of the read data.

In reference to FIG. 5 and in accordance with an embodiment of the present invention, a latched sense amplifier is not utilized. Rather, the appropriate address signal on address lines 552, 554 is provided to allow a read operation of bit lines 540, 542 without latching the data. Specifically, a data signal on bit line 540 passes through transistors 528 and 530, which form a transmission gate, and then is buffered by a buffer circuit 536 and driven out on output data line 538. Buffer circuit 536 represents a buffer, such as an inverter or a serial coupled pair of inverters (e.g., configured such as inverters 546 and 548), to receive and drive out the data value on bit line 540 onto output data line 538.

Transistors 524 and 526 serve to equalize and/or speed up a rise/fall time of signal levels on bit lines 540 and 542. Specifically, a data signal on bit line 540 and its complement on bit line 542 control transistors 524 and 526, respectively. If the data signal is a logical high value on bit line 540 for example, then transistor 524 will be switched off while transistor 526, which receives a complement of the data signal (i.e., a logical low value) from bit line 542, will begin to switch on as the data signal values on bit lines 540, 542 transition to their final (charged) value. Transistor 526 will thus assist bit line 540 in charging to a logical high value and provide buffer circuit 536 with the proper signal value.

If the data signal is a logical low value on bit line 540 for example, then transistor 524 will begin to switch on while transistor 526 will begin to switch off. When transistor 524 switches on, transistor 524 helps bit line 542 switch transistor 526 off and likewise, if transistor 526 is switching on, then transistor 526 helps bit line 540 switch transistor 524 off. Consequently, the rise/fall time on bit lines 540, 542 is equalized by transistors 524, 526 and the time for buffer circuit 536 to receive the final value from bit line 540 is reduced.

The operation of R/W circuit 500 may be viewed as performing a differential write operation (using bit lines 540, 542) and a single-ended read operation (using bit line 540 to determine a stored data value). Even though noise coupling might cause a momentary error in the data output signal during a read operation, the correct data value will eventually be provided as an output signal as the bit lines reach their final values. The read access time may be slower relative to some conventional memory circuits, because the bit lines are not precharged before a read operation and an associated sense amplifier does not have positive feedback to read and latch the data. However, the resulting potential for increased logic utilization and enhanced interconnect capability provides significant advantages for design implementation and integrated circuit efficiencies.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
a plurality of columns of memory;
a plurality of columns of logic circuits, wherein each of the columns of memory is disposed adjacent to one of the columns of logic circuits, with the plurality of columns of memory forming at least one block of memory having rows which extend through the plurality of columns of memory and comprises a fully interconnected memory, with each of the columns of memory partitioned into groups of memory cells; and
a decode circuit, coupled to the plurality of columns of memory, adapted to control word lines extending through the plurality of columns of memory, wherein the decode circuit is disposed in a column centrally located among the plurality of columns of memory.

2. The integrated circuit of claim 1, wherein each of the groups of memory cells is configured as a two by four memory block, with each memory cell being a two port static random access memory.

3. The integrated circuit of claim 1, further comprising read/write circuits, coupled to corresponding ones of the plurality of columns of memory, adapted to provide read/write capability via associated bit lines to the memory cells within the plurality of columns of memory.

4. The integrated circuit of claim 3, wherein the read/write circuits are disposed in a row centrally located within an area occupied by the plurality of columns of memory.

5. The integrated circuit of claim 3, wherein the read/write circuits perform a differential write via the associated bit lines and a single-ended read via one of the associated bit lines.

6. The integrated circuit of claim 3, wherein the read/write circuits further comprise:
a first transistor, coupled to a first one of the associated bit lines; and
a second transistor, coupled to a second one of the associated bit lines, wherein the second one of the associated bit lines controls a gate voltage of the first transistor and the first one of the associated bit lines controls a gate voltage of the second transistor to equalize a rise/fall time of signal levels on the associated bit lines.

7. The integrated circuit of claim 1, further comprising a clock row adapted to provide clock signals to the plurality of columns of memory and the plurality of columns of logic circuits.

8. The integrated circuit of claim 7, further comprising a power supply plane disposed around the plurality of columns of memory and the plurality of columns of logic circuits.

9. The integrated circuit of claim 1, wherein interconnect lines are disposed above and/or below the plurality of columns of memory to provide routing capability to the plurality of columns of logic circuits.

10. The integrated circuit of claim 1, wherein the plurality of columns of memory and the plurality of columns of logic circuits are replicated within the integrated circuit to form a plurality of the blocks of memory.

11. A circuit comprising:
a plurality of columns of memory;
a plurality of columns of circuits adaptable to perform logic functions, wherein each of the columns of memory is disposed adjacent to one of the plurality of columns of circuits, with the plurality of columns of memory forming at least one block of memory having rows which extend through the plurality of columns of memory; and
means for addressing and accessing memory cells within the at least one block of memory, wherein the means for addressing and accessing the memory cells is disposed in at least one row and column centrally located among the plurality of columns of memory.

12. The circuit of claim 11, wherein each of the columns of memory is partitioned into groups of memory cells, with each memory cell being a two port static random access memory.

13. The circuit of claim 11, wherein the means for addressing and accessing memory cells comprises:
   decode circuitry adapted to control signal levels on word lines extending through the plurality of columns of memory; and
   read/write circuitry adapted to provide read and write capability via bit lines to the plurality of columns of memory cells.

14. The circuit of claim 13, wherein the read/write circuitry performs a differential write via the bit lines and a single-ended read via one of the bit lines, with a pair of transistors coupled to the bit lines and controlled by respective ones of the bit lines to equalize a rise/fall time of signal levels on the bit lines.

15. The circuit of claim 13, wherein the circuit is replicated to form a plurality of the blocks of memory on an integrated circuit, and further comprising interconnect lines disposed above and/or below the plurality of columns of memory to provide interconnect routing to the plurality of columns of circuits.

16. A method of increasing utilization of logic circuits on an integrated circuit, the method comprising:
   arranging the logic circuits in a plurality of columns;
   disposing between each of the plurality of columns of the logic circuits a column of memory to reduce local interconnect congestion;
   interconnecting each of the columns of memory to form at least one block of memory whose rows extend through the columns of memory; and
   disposing read/write circuitry in a row centrally located within the at least one block of memory.

17. The method of claim 16, further comprising providing interconnect structure above and/or below the columns of memory to provide additional routing capability to the logic circuits in the plurality of columns.

18. The method of claim 17, further comprising partitioning each of the columns of memory into groups of memory cells, with each of the memory cells being two port static random access memory.

19. The method of claim 16, further comprising disposing decode circuitry in a column centrally located within the at least one block of memory.

* * * * *